(12) United States Patent
Jang

(10) Patent No.: US 10,978,298 B2
(45) Date of Patent: Apr. 13, 2021

(54) PRODUCTION OF SEMICONDUCTOR NANOWIRES DIRECTLY FROM SOLID PARTICLES

(71) Applicant: Nanotek Instruments, Inc., Dayton, OH (US)

(72) Inventor: Bor Z. Jang, Centerville, OH (US)

(73) Assignee: Global Graphene Group, Inc., Dayton, OH (US)

(*) Notice: Subject to any disclaimer, the term of this patent is extended or adjusted under 35 U.S.C. 154(b) by 13 days.

(21) Appl. No.: 16/250,491

(22) Filed: Jan. 17, 2019

(65) Prior Publication Data

US 2020/0234954 A1   Jul. 23, 2020

(51) Int. Cl.
| | |
|---|---|
| *H01L 21/02* | (2006.01) |
| *H01M 4/1395* | (2010.01) |
| *H01M 4/134* | (2010.01) |
| *H01M 4/38* | (2006.01) |
| *H01M 4/58* | (2010.01) |
| *H01M 4/1397* | (2010.01) |

(Continued)

(52) U.S. Cl.
CPC ...... *H01L 21/02603* (2013.01); *H01M 4/134* (2013.01); *H01M 4/136* (2013.01); *H01M 4/1395* (2013.01); *H01M 4/1397* (2013.01); *H01M 4/386* (2013.01); *H01M 4/581* (2013.01); *H01M 4/5805* (2013.01); *H01M 2004/021* (2013.01); *H01M 2004/027* (2013.01)

(58) Field of Classification Search
CPC . H01L 21/02603; H01M 4/581; H01M 4/136; H01M 4/386; H01M 4/134; H01M 4/1395; H01M 4/5805; H01M 4/1397; H01M 2004/027; H01M 2004/021
See application file for complete search history.

(56) References Cited

U.S. PATENT DOCUMENTS

| | | | |
|---|---|---|---|
| 7,615,206 B2 | 11/2009 | Sandhage et al. | |
| 9,774,033 B2* | 9/2017 | Fang | H01M 4/1395 |
| 2011/0309306 A1 | 12/2011 | Zhou et al. | |

(Continued)

FOREIGN PATENT DOCUMENTS

| | | |
|---|---|---|
| KR | 1020100007255 U | 7/2010 |
| KR | 1020120031119 A | 3/2012 |

OTHER PUBLICATIONS

PCT/US20/13977 International Search Report and Written Opinion dated May 12, 2020, 11 pages.

*Primary Examiner* — Karen Kusumakar

(57) ABSTRACT

Disclosed is a process for producing semiconductor nanowires having a diameter or thickness from 2 nm to 100 nm, the process comprising: (A) preparing a semiconductor material particulate having a size from 50 nm to 500 μm, selected from Ga, In, Ge, Sn, Pb, P, As, Sb, Bi, Te, a combination thereof, a compound thereof, or a combination thereof with Si; (B) depositing a catalytic metal, in the form of nanoparticles having a size from 1 nm to 100 nm or a coating having a thickness from 1 nm to 100 nm, onto surfaces of the semiconductor material particulate to form a catalyst metal-coated semiconductor material; and (C) exposing the catalyst metal-coated semiconductor material to a high temperature environment, from 100° C. to 2,500° C., for a period of time sufficient to enable a catalytic metal-assisted growth of multiple semiconductor nanowires from the particulate.

19 Claims, 6 Drawing Sheets

(51) Int. Cl.
 *H01M 4/136* (2010.01)
 *H01M 4/02* (2006.01)

(56) References Cited

U.S. PATENT DOCUMENTS

2012/0070964 A1* 3/2012 Perraud ............. H01L 21/02664
 438/478
2017/0149054 A1 5/2017 Fang et al.

* cited by examiner

———— 2 μm

———— 2 μm

PRODUCTION OF SEMICONDUCTOR NANOWIRES DIRECTLY FROM SOLID PARTICLES

FIELD OF THE INVENTION

This invention relates to a process for producing semiconductor nanowires for lithium-ion battery anode applications.

BACKGROUND

Lithium ion battery is a prime candidate energy storage device for electric vehicle (EV), renewable energy storage, and smart grid applications. Graphite materials have been widely used as an anode active material for commercial lithium ion batteries due to their relatively low cost and excellent reversibility. However, the theoretical lithium storage capacity of graphite is only 372 mAh/g (based on $LiC_6$), which can limit the total capacity and energy density of a battery cell. The emerging EV and renewable energy industries demand the availability of rechargeable batteries with a significantly higher energy density and power density than what the current Li ion battery technology can provide. Hence, this requirement has triggered considerable research efforts on the development of electrode materials with higher specific capacity, excellent rate capability, and good cycle stability for lithium ion batteries.

Several elements from Group III, IV, and V in the periodic table can form alloys with Li at certain desired voltages. Therefore, various anode materials based on such elements (e.g. Si, Ge, Sn, Sb, etc.), their compounds, and some metal oxides (e.g., $SnO_2$) have been proposed for lithium ion batteries. Among these, silicon is considered the most promising one since it has the highest theoretical specific capacity (up to 4,200 mAh/g in the stoichiometric form of $Li_{4.4}Si$) and low discharge potential (i.e., high operation potential when paired with a cathode).

However, using Si as an example, the dramatic volume changes (up to 380%) of Si during lithium ion alloying and de-alloying (cell charge and discharge) often led to severe and rapid battery performance deterioration. The performance fade is mainly due to the volume change-induced pulverization of Si and the inability of the binder/conductive additive to maintain the electrical contact between the pulverized Si particles and the current collector. In addition, the intrinsically low electric conductivity of silicon and other semiconductor materials is another challenge that needs to be addressed. Thus far, many attempts have been made to improve the electrochemical performance of Si-based anode materials, which include (1) reducing particle size to the nano-scale (<100 nm), such as Si nanoparticles, nanowires, or thin film, to reduce the total strain energy, which is a driving force for crack formation in the particle; (2) depositing Si particles on a highly electron-conducting substrate; (3) dispersing Si particles in an active or non-active matrix; and (4) coating Si particles with a layer of carbon. Although some promising anodes with specific capacities in excess of 1,000 mAh/g (at a low charge/discharge rate; e.g. 0.1 C) have been reported, it remains challenging to retain such high capacities over cycling (e.g., for more than 100 cycles) without significant capacity fading. Furthermore, at a higher C rate, Si particles and other high-capacity anode active material (Ge, Sn, etc.) are typically incapable of maintaining a high lithium storage capacity. It may be noted that a rate of n C means completing the charge or discharge cycle in 1/n hours: 0.1 C=10 hours, 0.5 C=2 hours, 3 C=⅓ hours or 20 minutes.

Although nano-scaled anode active materials, such as Ge nanoparticles, Si nanowires, and Sn nanofilms, are promising high-capacity anode materials, these materials remain too expensive to be economically viable. Again, using Si as an example, common methods used for producing silicon nanopowders include plasma-enhanced chemical vapor deposition (PECVD), laser-induced pyrolysis of $SiH_4$, and hot-wire synthesis methods. From mass production and cost perspectives, current processes for producing nano Si powder have been time-consuming and energy-intensive, also typically requiring the use of high-vacuum, high-temperature, and/or high-pressure production equipment. The resulting Si nanopowder products have been extremely expensive and this cost issue has severely impeded the full-scale commercialization of Si nanopowder materials. Hence, there exists a strong need for a more cost-effective process for producing Si nanopowder (e.g. Si nanowires or nanoparticles) in large quantities.

For instance, U.S. Pat. No. 7,615,206 issued on Nov. 10, 2009 to K. H. Sandhage and Z. H. Bao provides methods for the production of shaped nanoscale-to-microscale silicon through partially or completely converting a nanoscale-to-microscale silica template by using magnesium vapor. Magnesiothermic reduction of silica requires much lower temperatures (normally in the range from 600-800° C.) compared with the carbothermal reduction of silica (normally over 2000° C.) and thus has become a relatively popular technique used in pure metal production. Silicon is obtained by the following reaction: $2Mg+SiO_2 \rightarrow 2MgO+Si$. However, this process must be conducted under a high pressure condition and there is the danger of explosion not just during the reaction procedure (due to pressure vessel weakness), but also after the reaction is presumably completed when the reactor is opened (ultra-fast reaction of un-used Mg with air). Furthermore, when using Mg vapor to chemically reduce silica, magnesium silicide could be easily formed and, hence, this process is not suitable for mass production. Using magnesium powder will add to cost of producing nano-sized silicon and the particle size of magnesium could dramatically influence the reduction results and purity.

Herein, we present a facile and cost-effective method of mass-producing semiconductor nanowires. This method avoids all the problems commonly associated with conventional methods of producing nano-scaled semiconductor materials.

SUMMARY OF THE INVENTION

The present invention provides a process for producing semiconductor nanowires having a diameter or thickness from 2 nm to 100 nm, the process comprising: (A) preparing a solid semiconductor material in a particulate solid form having a size from 50 nm to 100 μm (preferably from 100 nm to 10 μm), wherein the semiconductor material (including metalloids) is selected from Ga, In, Ge, Sn, Pb, P, As, Sb, Bi, Te, a combination thereof, a compound thereof, or a combination thereof with Si (having less than 30% by weight of Si); (B) depositing a catalytic metal, in the form of nanoparticles having a size from 1 nm to 100 nm or a coating having a thickness from 1 nm to 100 nm, onto surfaces of the solid semiconductor material particulate to form a catalyst metal-coated semiconductor material; and (C) exposing said catalyst metal-coated semiconductor material to a high temperature environment, from 100° C. to 2,500° C., for a period of time sufficient to enable a catalytic metal-assisted growth of multiple semiconductor nanowires from the semiconductor material particulate. The compounds of these semiconductor materials include the III-VI compounds (e.g. InP, GaAs, GaP, etc.) and oxides, borides, carbides, nitrides of these elements, such as GaN, Their combinations with Si include alloys or compounds, such as $Ge_xSi_{1-x}$, where $0.5<x<1$ but the Si weight proportion is less than 30% by weight.

In certain embodiments, the catalytic metal is selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof, wherein said catalytic metal is different than the semiconductor material. Preferably, a catalytic metal and its pairing semiconductor material form an eutectic point in the phase diagram.

In certain embodiments, in the invented process, the step of depositing a catalytic metal includes (a) dissolving or dispersing a catalytic metal precursor in a liquid to form a precursor solution, (b) bringing the precursor solution in contact with surfaces of the solid semiconductor particulate material, (c) removing the liquid; and (d) chemically or thermally converting the catalytic metal precursor to the catalytic metal coating or nanoparticles.

In the process, the step (d) of chemically or thermally converting the catalytic metal precursor may be conducted concurrently with the procedure (C) of exposing the catalyst metal-coated mixture mass to a high temperature environment.

In certain embodiments, the catalytic metal precursor is a salt or organo-metal molecule of a metal selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof.

In some preferred embodiments, the catalytic metal precursor is selected from a nitrate, acetate, sulfate, phosphate, hydroxide, or carboxylate of a metal selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof.

In some embodiments, the catalytic metal precursor is selected from a nitrate, acetate, sulfate, phosphate, hydroxide, or carboxylate of a transition metal.

The step (C) of exposing the catalyst metal-coated semiconductor material to a high temperature environment is preferably conducted in steps, including at least at a lower temperature (first temperature) for a first period of time and then at a higher temperature (second temperature) for a second period of time. These temperatures can include a first temperature from 100° C. to 1,000° C. and a second temperature from 600° C. to 2,500° C. The heat treatment at the first temperature is mainly aimed at reducing the metal precursor (e.g. a metal salt) to a metal phase or to activate the metal coated on the semiconductor material. The heat treatment at the second temperature is aimed at building a thermodynamic environment conducive to initiation and growth of semiconductor nanowires from the semiconductor particulate. It may be noted that the required high temperature range depends on the catalytic metal used.

In certain embodiments, the semiconductor material and the pairing catalytic metal form an eutectic point in the phase diagram and the procedure of exposing the catalyst metal-coated semiconductor material to a high temperature environment includes exposing the material to a temperature equal to or higher than the eutectic point for a desired period of time and then bringing the material to a temperature below the eutectic point. In some embodiments, the exposure temperature is higher than the eutectic temperature by 0.5 to 500 degrees in Celsius scale (preferably by 1-100 degrees centigrade).

These semiconductor nanowires appear to have extruded out from the starting semiconductor particles and emanate from a center of the solid semiconductor particle. The semiconductor nanowires produced in this manner typically have a diameter less than 100 nm and a length-to-diameter aspect ratio of at least 5 (more typically l/d=10-10,000 and most typically 100-1,000).

In an embodiment, the step of depositing a catalytic metal on surfaces of the semiconductor particles includes (a) dissolving or dispersing a catalytic metal precursor in a liquid to form a precursor solution, (b) bringing said precursor solution in contact with surfaces of the semiconductor particle, (c) removing said liquid; and (d) chemically or thermally converting the catalytic metal precursor to the catalytic metal coating or nanoparticles. The step (d) of chemically or thermally converting the catalytic metal precursor is conducted concurrently with the procedure (C) of exposing the catalyst metal-coated material to a high temperature environment.

Preferably, the catalytic metal precursor is a salt or organo-metal molecule of catalytic metal precursor is a salt or organo-metal molecule of a metal selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof. Examples of the precursors include copper nitrate, nickel nitrate, cobalt nitrate, manganese nitrate, iron nitrate, titanium nitrate, aluminum nitrate, copper acetate, nickel acetate, cobalt acetate, manganese acetate, iron acetate, titanium acetate, aluminum acetate, copper sulfate, nickel sulfate, cobalt sulfate, manganese sulfate, iron sulfate, titanium sulfate, aluminum sulfate, copper phosphate, nickel phosphate, cobalt phosphate, manganese phosphate, iron phosphate, titanium phosphate, aluminum phosphate, copper hydroxide, nickel hydroxide, cobalt hydroxide, manganese hydroxide, iron hydroxide, titanium hydroxide, aluminum hydroxide, copper carboxylate, nickel carboxylate, cobalt carboxylate, manganese carboxylate, iron carboxylate, titanium carboxylate, aluminum carboxylate, or a combination thereof.

The catalytic metal is preferably selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof. They can be produced from the aforementioned precursors. Alternatively, the deposition of catalytic metal can be accomplished more directly. Thus, in an embodiment, the step of depositing a catalytic metal is conducted by a procedure of physical vapor deposition, chemical vapor deposition, sputtering, plasma deposition, laser ablation, plasma spraying, ultrasonic spraying, printing, electrochemical deposition, electrode plating, electrodeless plating, chemical plating, or a combination thereof.

The procedure of exposing the catalyst metal-coated semiconductor to a high temperature environment may be conducted in a protective atmosphere of an inert gas, nitrogen gas, hydrogen gas, a mixture thereof, or in a vacuum.

The presently invented process may further comprise a procedure of removing the catalytic metal from the semiconductor nanowires after the nanowires are produced; for instance, via chemical etching or electrochemical etching.

The process may further comprise a procedure of mixing semiconductor nanowires with a carbonaceous or graphitic material (as a conductive additive) and an optional binder material to form an electrode layer, wherein the carbonaceous or graphitic material is selected from a chemical vapor deposition carbon, physical vapor deposition carbon, amorphous carbon, chemical vapor infiltration carbon, polymeric carbon or carbonized resin, pitch-derived carbon, natural graphite, artificial graphite, mesophase carbon, mesophase pitch, mesocarbon microbead, soft carbon, hard carbon, coke, carbon fiber, carbon nano-fiber, carbon nano-tube, carbon black, or a combination thereof.

The present invention also provides a process for producing semiconductor nanowires having a diameter or thickness from 2 nm to 100 nm, the process comprising: (a) preparing a solid semiconductor material in a particulate solid form having a size from 50 nm to 100 µm, wherein said semiconductor material is selected from Ga, In, Ge, Sn, Pb, P, As, Sb, Bi, Te, a combination thereof, a compound thereof, or a combination thereof with Si; (b) depositing a catalyst metal precursor onto surfaces of the solid semiconductor material particulate to form a catalyst metal precursor-coated semiconductor material; and (c) exposing the catalyst metal precursor-coated semiconductor material to a high temperature environment, from 100° C. to 2,500° C., for a period of time sufficient to convert the catalyst metal precursor to a metal catalyst in the form of nanoparticles having a size from 1 nm to 100 nm or a coating having a thickness from 1 nm to 100 nm in physical contact with the particulate, and enable a catalyst metal-assisted growth of multiple semiconductor nanowires from the semiconductor material particulate. It is essential that the catalyst metal nanoparticles coating are in physical contact with the semiconductor particulate, preferably deposited on surfaces of the particulate.

In certain preferred embodiments, the semiconductor material and the catalyst metal form an eutectic point step (c) of exposing the catalyst metal precursor-coated semiconductor material to a high temperature environment includes exposing the material to an exposure temperature equal to or higher than the eutectic point for a desired period of time and then bringing the material to a temperature below this exposure temperature for a desired period of time or at a desired temperature decreasing rate.

The present invention also provides a battery electrode containing semiconductor nanowires that are produced by the inventive process. Also provided is a lithium battery containing semiconductor nanowires produced by the inventive process as an anode active material.

DETAILED DESCRIPTION OF PREFERRED EMBODIMENTS

The present invention provides a process for initiating and growing semiconductor nanowires from micron or sub-micron scaled semiconductor particles having an original particle diameter (prior to nanowire growth) from 50 nm to 500 µm (preferably from 100 nm to 20 µm). In other words, the starting material is micron or sub-micron scaled semiconductor particles, which are thermally and catalytically converted directly into nano-scaled, wire-shaped structures having a diameter or thickness from 2 nm to 100 nm.

Figure 4:
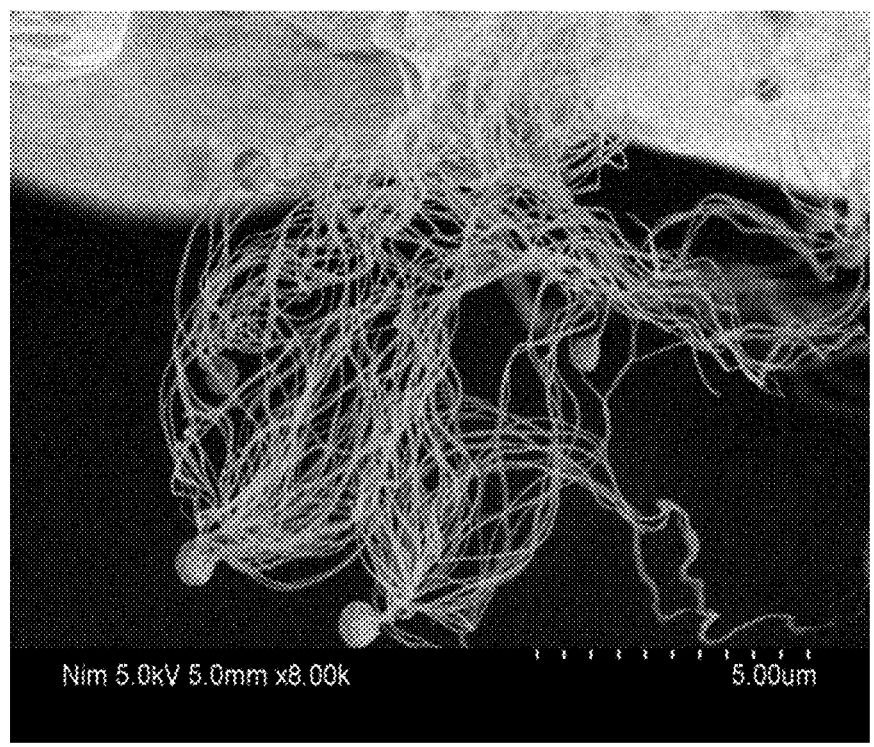
FIG. 4 SEM image of Si nanowires
FIG. 5 SEM image of Ge nanowires.
Figure 5:
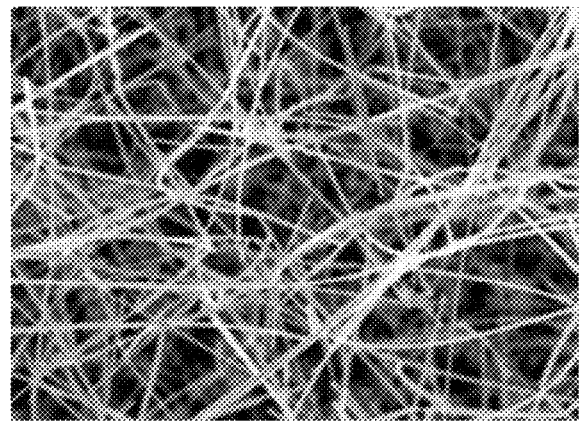
Figure 6:
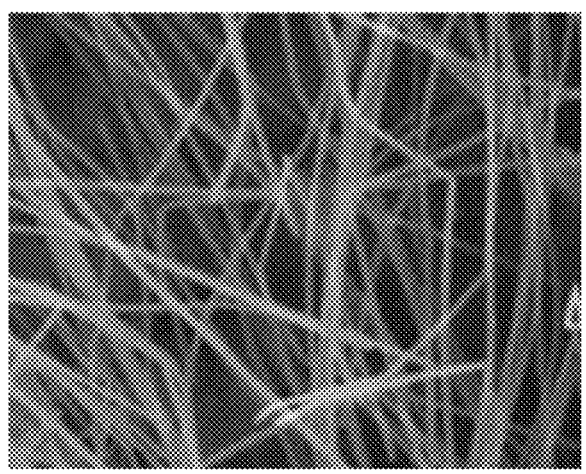
FIG. 6 SEM image of Sn nanowires.

Studies using scanning electron microscopy (SEM) indicate that tens of nanowires can be grown or "extruded out" from a starting solid semiconductor particle. As an example, FIG. 4 shows that tens of Si nanowires have been sprouted or emanated from each Si particle that was originally 2-3 µm in diameter. These Si nanowires have drawn the needed Si atoms from the few starting Si particles. By spitting out a large number of nanowires, the original Si particles, if smaller than 2 µm in diameter, were fully expended. When larger particles having an original diameter >3 µm were used, there were typically some residual Si particles left. SEM images of Ge nanowires and Sn nanowires are shown in FIG. 5 and FIG. 6, respectively.

There are several advantages associated with this process. For instance, there is no chemical reaction (such as converting $SiH_4$ into Si in a CVD process) and the process does not involve any undesirable chemical, such as silane, which is toxic. There is no danger of explosion, unlike the process of converting $GeO_2$ to Ge or $SiO_2$ to Si using magnesium vapor. Other additional advantages will become more transparent later.

Figure 1:
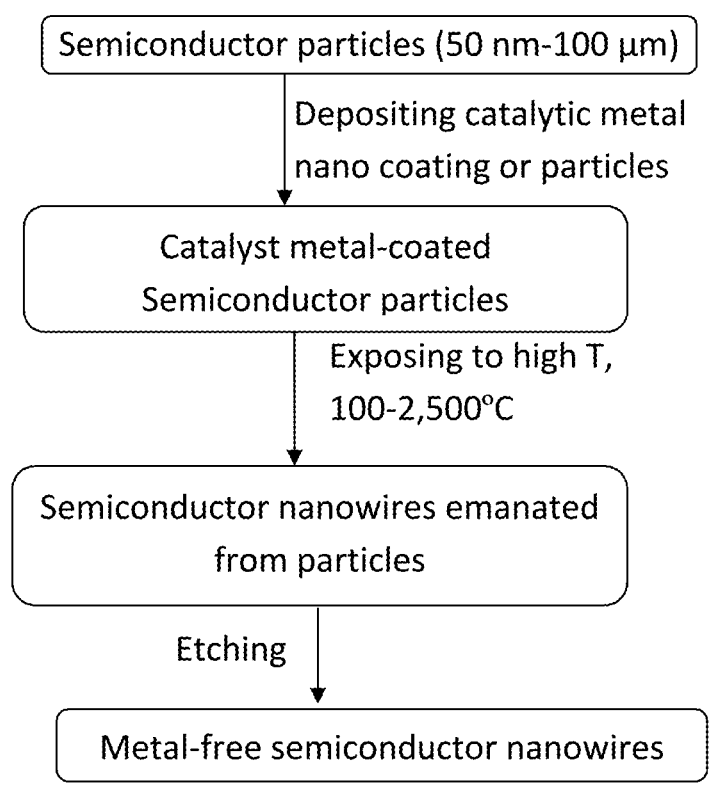
FIG. 1 A flow chart showing a preferred route to preparing semiconductor nanowires from particles of the same semiconductor material, having a diameter from 50 nm to 100 µm.

As illustrated in FIG. 1, in certain embodiments, the invented process begins by preparing a catalyst metal-coated semiconductor particle. This is accomplished by carrying out the following procedures: (A) preparing a semiconductor in a particulate form having a size from 50 nm to 500 µm, wherein the semiconductor material contains neat semiconductor element (having at least 99.9% by weight of Ge, for instance) or a Ge alloy or mixture (having from 70% to 99.9% by weight of Ge therein); and (B) depositing a catalytic metal, in the form of nanoparticles having a size from 1 nm to 100 nm or a coating having a thickness from 1 nm to 100 nm, onto surfaces of the semiconductor material to form a catalyst metal-coated semiconductor material. This is then followed by step (C) of exposing the catalyst metal-coated semiconductor material to a high temperature environment, from 100° C. to 2,500° C., for a period of time sufficient to enable a catalytic metal-catalyzed growth of multiple semiconductor nanowires from the semiconductor material particle. These semiconductor nanowires are emanated or extruded out from the semiconductor particles, which act as the source material for the growing semiconductor nanowires to feed on.

The starting semiconductor particles preferably have a diameter from 100 nm to 10 µm, more preferably <3 µm. The starting semiconductor particles are preferably spherical, cylindrical, or platelet (disc, ribbon, etc.) in shape, but can be of any shape. Semiconductor particles of various shapes and various particle sizes are commercially available.

Figure 2:
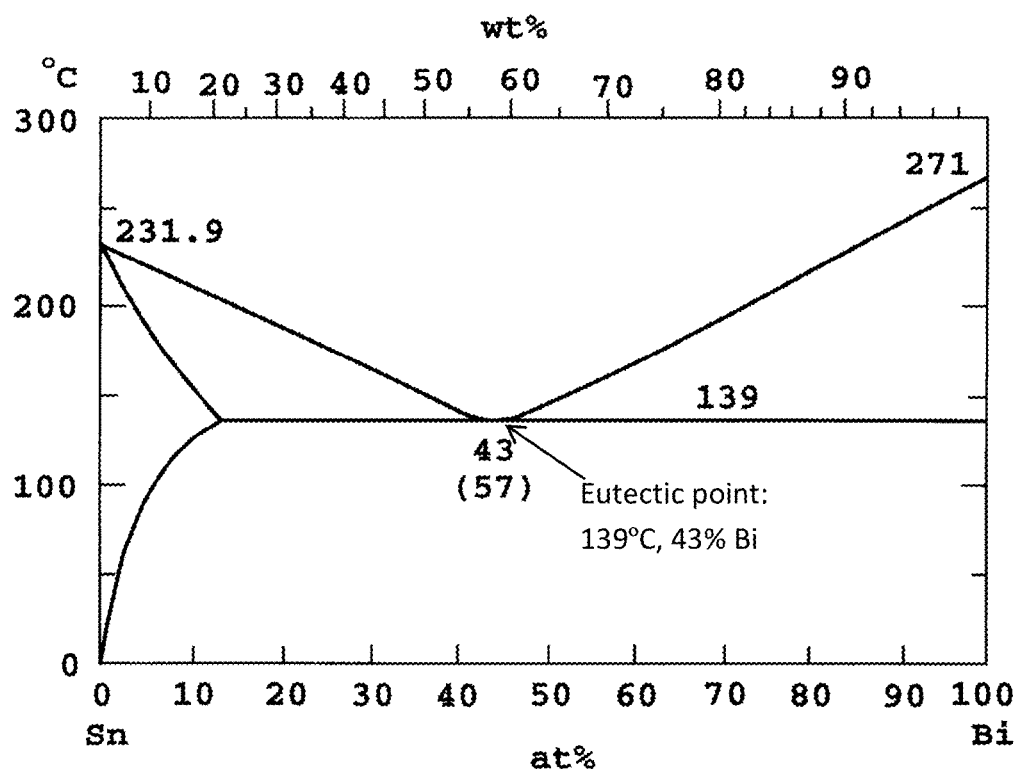
FIG. 2 Phase diagram of the Bi—Sn system.
Figure 3:
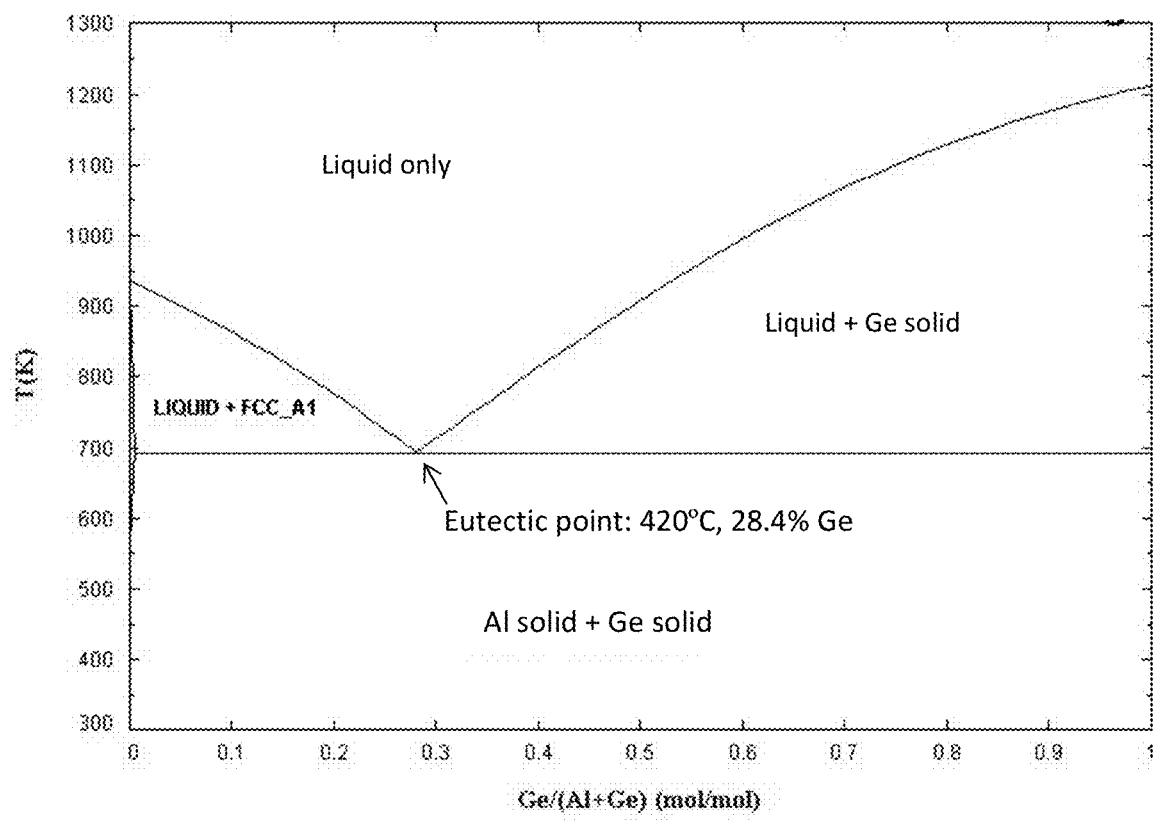
FIG. 3 Phase diagram of the Al—Ge system.

It may be noted that this high temperature range depends on the catalytic metal used. Two examples are used herein to illustrate the best mode of practice. Shown in FIG. 2 and FIG. 3 are phase diagrams of the Sn—Bi and Ge—Al system, respectively. In the first example, Sn is the semiconductor material and Bi is the catalyst metal and, in the second example, Ge is the semiconductor and Al is the catalyst metal.

In the Sn—Bi binary system, there exists a eutectic point at a eutectic temperature Te=139° C. and eutectic composition Ce=46% (atomic percentage of Bi). A mass of Bi-coated Sn particles may be slowly heated to above Te (e.g. a high temperature from 139.5° C. to 230° C., lower than both the melting temperature of the semiconductor, 231.9° C., and the melting temperature of the catalyst metal, 271° C.). The heating rate can be from 1 to 100 degrees/min (centigrade scale). One can allow the Bi-coated Sn particles to stay at this high temperature (say 170° C.) for 1 minute to 3 hours and then cool the material down to 145° C. (slightly above Te) and/or even 135° C. (slightly below Te) for 1-180 minutes. This will lead to the formation of Sn nanowires from the coated Sn particles.

In the Ge—Al binary system, there exists a eutectic point at a eutectic temperature Te=420° C. and eutectic composition Ce=71.6% (atomic percentage of Al). A mass of Al-coated Ge particles may be slowly heated to above Te (e.g. a high temperature from 421° C. to 600° C., lower than both the melting temperature of the semiconductor, 938.2° C., and the melting temperature of the catalyst metal, 660.3° C.). The heating rate can be from 1 to 100 degrees/min (centigrade scale). One can allow the Al-coated Ge particles to stay at this high temperature (say 460° C.) for 1 minute to 3 hours and then cool the material down to 430° C. (slightly above Te) and/or even 415° C. (slightly below Te) for 1-180 minutes. This will lead to the formation of Ge nanowires from the coated Sn particles. Alternatively, one may choose to cool the material slowly down from 460° C. (after staying at this temperature for a desired period of time) to room temperature.

In some embodiments, the step of depositing a catalytic metal includes: (a) dissolving or dispersing a catalytic metal precursor in a liquid to form a precursor solution; e.g. dissolving nickel nitrate, $Ni(NO_3)_2$, in water; (b) bringing the precursor solution in contact with surfaces of semiconductor particles; e.g. immersing the particles into the $Ni(NO_3)_2$-water solution; (c) removing the liquid component; e.g. vaporizing water of the $Ni(NO_3)_2$-water solution, allowing $Ni(NO_3)_2$ to coat on the surfaces of the semiconductor particles; and (d) chemically or thermally converting the catalytic metal precursor (e.g. $Ni(NO_3)_2$) to the catalytic metal coating or metal nanoparticles; e.g. by heating the $Ni(NO_3)_2$-coated mass at 450-650° C. in a reducing environment (e.g. in a flowing gas mixture of hydrogen and argon).

In one embodiment, the step (d) of chemically or thermally converting the catalytic metal precursor is conducted concurrently with the step of exposing the catalyst metal-coated semiconductor particles to a high temperature environment.

In certain embodiments, the catalytic metal precursor is a salt or organo-metal molecule of a metal selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof.

In some preferred embodiments, the catalytic metal precursor is selected from a nitrate, acetate, sulfate, phosphate, hydroxide, or carboxylate of a metal selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof.

In some embodiments, the catalytic metal precursor is selected from a nitrate, acetate, sulfate, phosphate, hydroxide, or carboxylate of a transition metal. In certain embodiments, for instance, the catalytic metal precursor is selected from copper nitrate, nickel nitrate, cobalt nitrate, manganese nitrate, iron nitrate, titanium nitrate, aluminum nitrate, copper acetate, nickel acetate, cobalt acetate, manganese acetate, iron acetate, titanium acetate, aluminum acetate, copper sulfate, nickel sulfate, cobalt sulfate, manganese sulfate, iron sulfate, titanium sulfate, aluminum sulfate, copper phosphate, nickel phosphate, cobalt phosphate, manganese phosphate, iron phosphate, titanium phosphate, aluminum phosphate, copper carboxylate, nickel carboxylate, cobalt carboxylate, manganese carboxylate, iron carboxylate, titanium carboxylate, aluminum carboxylate, or a combination thereof. Different types of precursor require different temperatures and/or chemical reactants for conversion to the catalytic metal phase. Different catalytic metals enable semiconductor nanowire growth at different temperatures.

The step of depositing a catalytic metal may also be conducted by a procedure of physical vapor deposition (PVD), chemical vapor deposition (CVD), sputtering, plasma deposition, laser ablation, plasma spraying, ultrasonic spraying, printing, electrochemical deposition, electrode plating, electrodeless plating, chemical plating, or a combination thereof.

The procedure of exposing the catalyst metal-coated semiconductor mass to a high temperature environment is preferably conducted in a protective or reducing atmosphere of an inert gas, nitrogen gas, hydrogen gas, a mixture thereof, or in a vacuum.

In one embodiment, the process may further comprise a procedure of removing the residual catalytic metal from the semiconductor nanowires; for instance, via chemical etching or electrochemical etching.

In a desired embodiment, the process of producing semiconductor nanowires is followed by a procedure of incorporating a carbonaceous or graphitic material into the mass of multiple semiconductor nanowires as a conductive additive in the preparation of an anode electrode. This carbonaceous or graphitic material may be selected from a chemical vapor deposition carbon, physical vapor deposition carbon, amorphous carbon, chemical vapor infiltration carbon, polymeric carbon or carbonized resin, pitch-derived carbon, natural graphite, artificial graphite, mesophase carbon, mesophase pitch, mesocarbon microbead, soft carbon, hard carbon, coke, carbon fiber, carbon nano-fiber, carbon nanotube, carbon black, or a combination thereof.

For instance, multiple Ge nanowires may be readily packed into a porous membrane or mat (with or without a small amount of resin binder), which may be impregnated or infiltrated with carbon under a chemical vapor deposition (CVD) or chemical vapor infiltration condition. This may be accomplished by introducing methane or ethylene gas into the system at a temperature of 500-1,500° C. Alternatively, one may impregnate the porous Ge nanowire membrane with a resin or pitch, which is then heated to carbonize the resin or pitch at a temperature of 350-1,500° C. Alternatively, one may simply blend semiconductor nanowires with particles of a carbon or graphite material with an optional binder resin to form a multi-component mixture.

The following examples are provided for the purpose of illustrating the best mode of practicing the present invention and should not be construed as limiting the scope of the instant invention. The selection of the following semiconductor materials as examples is based on the consideration that they have a high specific capacity when used as an anode active material: $Li_{4.4}Ge$ (1,623 mAh/g), $Li_{4.4}Sn$ (993 mAh/g), and $Li_3Sb$ (660 mAh/g).

Example 1: Zinc-Assisted Growth of Sn Nanowires from Sn Particles

Tin particles were coated with a thin layer of Zn using a simple physical vapor deposition up to a thickness of 1.1-3.5 nm. The Sn—Zn system is known to have a eutectic point at Te=198.5° C. and Ce=85.1% Sn. A powder mass of Zn-coated Sn particles (3.5 μm in diameter) were heated to 220° C. and allowed to stay at 220° C. for 1 hour and then cooled down to 200° C. and maintained at 200° C. for 30 minutes. The material system was then naturally cooled to room temperature after switching off the power to the oven. The Sn nanowires grown from Sn particles were found to have diameters in the approximate range of 25-65 nm.

Example 2: Gold-Assisted Growth of Ge Nanowires from Ge Particles

Ge particles (platelets of 1.2 μm long and 0.25 μm thick) were coated with a thin layer of Au using sputtering deposition up to a thickness of 1.5-5.6 nm. The Ge—Au system is known to have a eutectic point at Te=361° C. and Ce=28% Ge. A powder mass of Au-coated Ge particles were heated to 600° C. and allowed to stay at 600° C. for 2 hours and then cooled down to 370° C. and maintained at 370° C. for 1 hour. The material system was then cooled to 355° C. for 2 hours and then naturally cooled to room temperature after switching off the power to the oven.

Gold catalyst-assisted growth of Ge nanowires from Ge particles occurred during the subsequent cooling process. The diameter of Ge nanowires produced is in the range from 42 nm to 67 nm.

Example 3: Nickel-Assisted Growth of Ge Nanowires from Ge Particles

Ge particles were immersed in a solution of nickel nitrate or nickel acetate in water. Water was subsequently removed and the dried particles were coated with a thin layer of nickel nitrate or nickel acetate. These metal precursor-coated Ge particles were then exposed to a heat treatment in a reducing atmosphere of $H_2$ and Ar gas according to a desired temperature profile. This profile typically included from room temperature to a reduction temperature of approximately 300-700° C. (for reduction of nickel nitrate or acetate to Ni nanocoating, for instance). The temperature was continued to rise to a final temperature of 762-900° C. for 1-3 hours and the system was allowed to cool down naturally. Nickel metal catalyst-assisted growth of Ge nanowires from Ge particles was found to occur. The diameter of Ge nanowires produced was in the range from 47 nm to 77 nm.

Example 4: Copper-Assisted Growth of Sb Nanowires from Sb Particles

The work began with the preparation of antimony (Sb) particles, which entailed mixing $Sb_2O_3$ particles with small activated carbon (AC) particles using ball milling. By heating the resulting mixture in a sealed autoclave and heating the mixture to 950° C., antimony was obtained from the oxide by a carhothermal reduction: $2Sb_2O_3+3C\rightarrow 4Sb+3CO_2$. The Sb particles produced typically resided in pores of AC, which could be recovered by breaking up the AC particles with ball-milling.

The Sb particles were immersed in a solution of copper acetate in water. Water was subsequently removed and the dried particles were coated with a thin layer of copper acetate. These metal precursor-coated Sb particles were then exposed to a heat treatment in a reducing atmosphere of $H_2$ and Ar gas according to a desired temperature profile. This profile typically included from room temperature to a reduction temperature of approximately 300-600° C. (for reduction of copper acetate to Cu nanocoating). The temperature was continued to rise to a final temperature of 526-620° C. for 1-3 hours. The system was allowed to cool down to 520° C. for 1 hour and then cooled down naturally to room temperature, resulting in copper metal catalyst-assisted growth of Sb nanowires from Sb particles.

Example 5: Lithium-Ion Batteries Featuring Ge and Sn Nanowires as an Anode Active Material For electrochemical testing, several types of anodes and cathodes were prepared. For instance, a layer-type of anode was prepared by simply coating slurry of Ge or Sn nanowires, conductive additives, and a binder resin to form an anode layer against a sheet of Cu foil (as an anode current collector).

For instance, the working electrodes were prepared by mixing 75 wt. % active material (Ge or Sn nanowires), 17 wt. % acetylene black (Super-P, as a conductive additive), and 8 wt. % polyvinylidene fluoride (PVDF) as a binder dissolved in N-methyl-2-pyrrolidinoe (NMP). After coating the slurries on Cu foil, the electrodes were dried at 120° C. in vacuum for 2 h to remove the solvent before a compression treatment.

Then, the electrodes were cut into a disk ($\phi$=12 mm) and dried at 100° C. for 24 h in vacuum. Electrochemical measurements were carried out using CR2032 (3V) coin-type cells with lithium metal as the counter/reference electrode, Celgard 2400 membrane as separator, and 1 M $LiPF_6$ electrolyte solution dissolved in a mixture of ethylene carbonate (EC) and diethyl carbonate (DEC) (EC-DEC, 1:1 v/v). Various anode material compositions were evaluated. The cell assembly was performed in an argon-filled glovebox. The CV measurements were carried out using a CH-6 electrochemical workstation at a scanning rate of 1 mV/s. The electrochemical performance of Si nanowires was also evaluated by galvanostatic charge/discharge cycling at a current density of 50-1,000 mA/g, using a LAND electrochemical workstation. Full-cell pouch configurations using lithium iron phosphate and lithium cobalt oxide cathodes were also prepared and tested.

It may be noted that the lithium-ion battery industry has adopted a nomenclature system for a charge or discharge rate. For instance, 1 C charging means completing charging procedure in 1 hour and 2 C charging means completing charging procedure in ½ hours (30 minute). A 10 C charging rate means charging completion in 1/10 hours (6 minutes).

Figure 7:
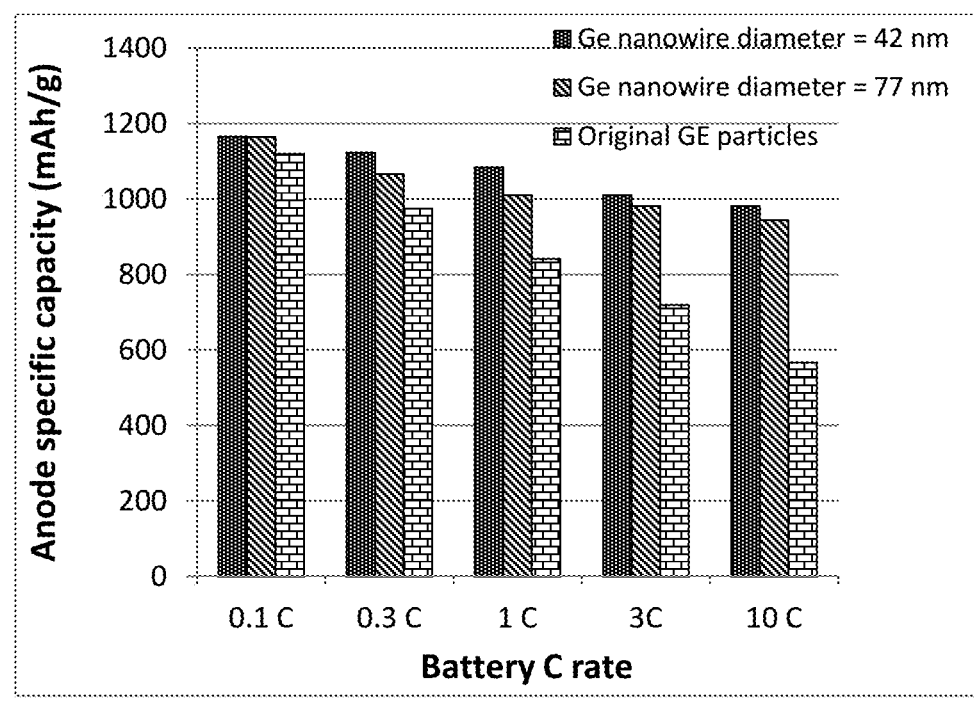
FIG. 7 The effect of nanowire or particle size on the rate capability of an anode active material in a lithium-ion battery.

Some experimental results are summarized in FIG. 7, which indicates that the composite anode containing 75% by wt. of Ge nanowires having a diameter of 42 nm is capable of delivering a lithium storage capacity of 1,166 mAh/g (based on the total electrode composite weight, not just the Ge weight) at 0.1 C rate and 982 mAh/g at 10 C rate. At this ultra-high rate of 10 C, one can complete the charge or discharge in 1/10 hours or 6 minutes. In contrast, the lithium battery cell featuring original Ge particles as the anode active material exhibits a specific capacity of 1,120 mAh/g at 0.1 C rate, but the specific capacity drops to 567 mAh/g at a 10 C charge rate. This is a tremendous accomplishment. Imagine you can totally recharge your smart phone in 6 minutes. As of now, it typically takes 2 hours. As a point of reference, natural graphite, the most commonly used anode active material, is capable of storing lithium up to 370 mAh/g at 0.1 C rate, but only 250 mAh/g at 10 C rate.

Similar tends were observed for lithium-ion batteries that contain other types of semiconductor nanowires herein produced as the primary anode active material. These observations have demonstrated that smaller-diameter nanowires are significantly more high-rate capable in a lithium-ion battery. The present invention provides a cost-effective process for producing a wide variety of semiconductor nanowires.

I claim:

1. A process for producing semiconductor nanowires having a diameter or thickness from 2 nm to 100 nm, said process comprising:
   (A) preparing a solid semiconductor material in a particulate solid form having a size from 50 nm to 500 μm, wherein said semiconductor material is selected from Ga, In, Sn, Pb, P, As, Sb, Bi, Te, a combination thereof, a compound thereof excluding III-V semiconductor compounds, or a combination thereof with Si having less than 30% by weight of Si;
   (B) depositing a catalytic metal, in the form of nanoparticles having a size from 1 nm to 100 nm or a coating having a thickness from 1 nm to 100 nm, onto surfaces of said solid semiconductor material particulate to form a catalyst metal-coated semiconductor material; and
   (C) exposing said catalyst metal-coated semiconductor material to a high temperature environment, from 100° C. to 2,500° C., for a period of time sufficient to enable a catalytic metal-assisted growth of multiple semiconductor nanowires from said semiconductor material particulate.

2. The process of claim 1, wherein said solid semiconductor material particulate has a diameter from 100 nm to 10 μm.

3. A process for producing semiconductor nanowires having a diameter or thickness from 2 nm to 100 nm, said process comprising:
   (A) preparing a solid semiconductor material in a particulate solid form having a size from 50 nm to 500 μm, wherein said semiconductor material is selected from Ga, In, Ge, Sn, Pb, P, As, Sb, Bi, Te, a combination thereof, a compound thereof, or a combination thereof with Si having less than 30% by weight of Si;
   (B) depositing a catalytic metal, in the form of nanoparticles having a size from 1 nm to 100 nm or a coating having a thickness from 1 nm to 100 nm, onto surfaces of said solid semiconductor material particulate to form a catalyst metal-coated semiconductor material, wherein said catalytic metal is selected from Pb, Bi, Sb, Zn, Cd, Ga, In, Zr, Te, P, Sn, or a combination thereof, wherein said catalytic metal is different than said semiconductor material; and
   (C) exposing said catalyst metal-coated semiconductor material to a high temperature environment, from 100° C. to 2,500° C., for a period of time sufficient to enable a catalytic metal-assisted growth of multiple semiconductor nanowires from said semiconductor material particulate.

4. The process of claim 1, wherein said step of depositing a catalytic metal includes (a) dissolving or dispersing a catalytic metal precursor in a liquid to form a precursor solution, (b) bringing said precursor solution in contact with surfaces of said solid semiconductor particulate material, (c) removing said liquid; and (d) chemically or thermally converting said catalytic metal precursor to said catalytic metal coating or nanoparticles.

5. The process of claim 4, wherein said step (d) of chemically or thermally converting said catalytic metal precursor is conducted concurrently with the procedure (C) of exposing said catalyst metal-coated mixture mass to a high temperature environment.

6. The process of claim 4, wherein said catalytic metal precursor is a salt or organo-metal molecule of a metal selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof.

7. The process of claim 4, wherein said catalytic metal precursor is selected from a nitrate, acetate, sulfate, phosphate, hydroxide, or carboxylate of a metal selected from Cu, Ni, Co, Mn, Fe, Ti, Al, Ag, Au, Pt, Pd, Pb, Bi, Sb, Zn, Cd, Ga, In, Zr, Te, P, Sn, or a combination thereof.

8. The process of claim 4, wherein said catalytic metal precursor is selected from a nitrate, acetate, sulfate, phosphate, hydroxide, or carboxylate of a transition metal.

9. The process of claim 4, wherein said catalytic metal precursor is selected from copper nitrate, nickel nitrate, cobalt nitrate, manganese nitrate, iron nitrate, titanium nitrate, aluminum nitrate, copper acetate, nickel acetate, cobalt acetate, manganese acetate, iron acetate, titanium acetate, aluminum acetate, copper sulfate, nickel sulfate, cobalt sulfate, manganese sulfate, iron sulfate, titanium sulfate, aluminum sulfate, copper phosphate, nickel phosphate, cobalt phosphate, manganese phosphate, iron phosphate, titanium phosphate, aluminum phosphate, copper hydroxide, nickel hydroxide, cobalt hydroxide, manganese hydroxide, iron hydroxide, titanium hydroxide, aluminum hydroxide, copper carboxylate, nickel carboxylate, cobalt carboxylate, manganese carboxylate, iron carboxylate, titanium carboxylate, aluminum carboxylate, or a combination thereof.

10. The process of claim 1, wherein said step of depositing a catalytic metal is conducted by a procedure of physical vapor deposition, chemical vapor deposition, sputtering, plasma deposition, laser ablation, plasma spraying, ultrasonic spraying, printing, electrochemical deposition, electrode plating, electrodeless plating, chemical plating, or a combination thereof.

11. The process of claim 1, wherein said procedure of exposing said catalyst metal-coated semiconductor material to a high temperature environment is conducted in a protective atmosphere of an inert gas, nitrogen gas, hydrogen gas, a mixture thereof, or in a vacuum.

12. The process of claim 1, wherein said semiconductor material and said catalytic metal form an eutectic point and said procedure of exposing said catalyst metal-coated semiconductor material to a high temperature environment includes exposing said material to a temperature equal to or higher than said eutectic point for a desired period of time and then bringing said material to a temperature below said eutectic point.

13. The process of claim 12, wherein said exposure temperature is higher than said eutectic temperature by 0.5 to 500 degrees in Celsius scale.

14. The process of claim 1, further comprising a procedure of removing said catalytic metal from said semiconductor nanowires.

15. The process of claim 1, further comprising a procedure of mixing semiconductor nanowires with a carbonaceous or graphitic material as a conductive additive and an optional binder material to form an electrode layer, wherein said carbonaceous or graphitic material is selected from a chemical vapor deposition carbon, physical vapor deposition carbon, amorphous carbon, chemical vapor infiltration carbon, polymeric carbon or carbonized resin, pitch-derived carbon, natural graphite, artificial graphite, mesophase carbon, mesophase pitch, mesocarbon microbead, soft carbon, hard carbon, coke, carbon fiber, carbon nano-fiber, carbon nano-tube, carbon black, or a combination thereof.

16. A battery electrode containing semiconductor nanowires produced by the process of claim 1.

17. A lithium battery containing semiconductor nanowires produced by the process of claim 1 as an anode active material.

18. A process for producing semiconductor nanowires having a diameter or thickness from 2 nm to 100 nm, said process comprising:
   a) preparing a solid semiconductor material in a particulate solid form having a size from 50 nm to 100 μm, wherein said semiconductor material is selected from Ga, In, Sn, Pb, P, As, Sb, Bi, Te, a combination thereof, a compound thereof excluding III-V semiconductor compounds, or a combination thereof with Si having no greater than 30% by weight of Si;
   b) depositing a catalyst metal precursor onto surfaces of said solid semiconductor material particulate to form a catalyst metal precursor-coated semiconductor material; and
   c) exposing said catalyst metal precursor-coated semiconductor material to a high temperature environment, from 100° C. to 2,500° C., for a period of time sufficient to convert said catalyst metal precursor to a metal catalyst in the form of nanoparticles having a size from 1 nm to 100 nm or a coating having a thickness from 1 nm to 100 nm in physical contact with said semiconductor material particulate, and enable a catalyst metal-assisted growth of multiple semiconductor nanowires from said semiconductor material particulate.

19. The process of claim 18, wherein said semiconductor material and said catalyst metal form an eutectic point and said step (c) of exposing said catalyst metal precursor-coated semiconductor material to said high temperature environment includes exposing said material to an exposure temperature equal to or higher than said eutectic point for a desired period of time and then bringing said material to a temperature below said exposure temperature for a desired period of time or at a desired temperature decreasing rate.

* * * * *